US006292010B1

(12) United States Patent
Persons et al.

(10) Patent No.: US 6,292,010 B1
(45) Date of Patent: Sep. 18, 2001

(54) DYNAMIC PIN DRIVER COMBINING HIGH VOLTAGE MODE AND HIGH SPEED MODE

(75) Inventors: Thomas W. Persons, Los Altos, CA (US); Charles D. Bishop, Wrentham, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/496,690

(22) Filed: Feb. 2, 2000

(51) Int. Cl.$^7$ .................................................. G01R 31/22
(52) U.S. Cl. .................................. 324/765; 324/158.1
(58) Field of Search .............................. 326/89, 82, 90, 326/30; 324/765, 158.1

(56) References Cited

U.S. PATENT DOCUMENTS

| | | | |
|---|---|---|---|
| 4,572,971 | 2/1986 | Necoechea | 307/260 |
| 4,623,799 | 11/1986 | Nyman, Jr. | 307/260 |
| 5,146,159 | 9/1992 | Lau et al. | 324/158 R |
| 5,319,258 | 6/1994 | Ruetz | 307/443 |
| 5,338,987 | 8/1994 | Tomasetti et al. | 307/570 |
| 5,410,267 | 4/1995 | Haycock et al. | 326/81 |
| 5,493,519 | 2/1996 | Allen, III | 364/579 |
| 5,521,493 | * 5/1996 | Persons | 324/158.1 |
| 5,757,217 | 5/1998 | Thompson | 327/170 |
| 5,767,698 | 6/1998 | Emeigh et al. | 326/83 |
| 5,818,260 | 10/1998 | Kuo | 326/86 |
| 5,844,913 | 12/1998 | Hassoun et al. | 371/21.1 |
| 5,942,922 | 8/1999 | Dinteman et al. | 327/108 |
| 5,970,255 | 10/1999 | Tran et al. | 395/893 |

* cited by examiner

Primary Examiner—Safet Metjahic
Assistant Examiner—Vincent Q. Nguyen
(74) Attorney, Agent, or Firm—Bruce D. Rubenstein

(57) ABSTRACT

A driver circuit for automatic test equipment provides high voltage range and high frequency. The driver circuit includes a voltage buffer that has high voltage swing and is capable of dynamically generating an output voltage that alternates between two statically established voltage levels. The driver circuit also includes a current buffer that has high speed and is capable of dynamically generating an output current that alternates between two statically established current levels. The voltage buffer and the current buffer each have an output, and the output of the voltage buffer is coupled to the output of the current buffer through a series impedance. The output of the current buffer is also coupled to a device under test (DUT). A control circuit directs the voltage buffer and the current buffer to generate either static or dynamic output signals. If it is desired to generate an output signal having high voltage swing, the control signal operates the current buffer statically and operates the voltage buffer dynamically. If, however, high frequency is desired, the control circuit operates voltage buffer statically and the current buffer dynamically. Thus, the advantages of both the voltage buffer and the current buffer are achieved in a single driver circuit.

25 Claims, 3 Drawing Sheets

DYNAMIC PIN DRIVER COMBINING HIGH VOLTAGE MODE AND HIGH SPEED MODE

This invention relates generally to driver circuits for automatic test equipment, and more particularly to driver circuits for providing stimuli to a device under test under dynamic control.

BACKGROUND OF THE INVENTION

Automatic test equipment (ATE) plays a significant role in the manufacture of semiconductor devices. Manufacturers generally use automatic test equipment, or "testers," to verify the operation of semiconductor devices at the wafer and packaged device stages of the semiconductor manufacturing process. By verifying the operation of semiconductor devices at these stages, manufacturers are able to reject defective devices early in the manufacturing process. Early detection of faults eliminates costs that would otherwise be incurred by processing defective parts, and thus reduces the overall costs of manufacturing. Manufacturers also use ATE to grade various specifications of devices. Devices can be tested and categorized into different bins that correspond to different levels of performance in significant areas, for example, speed. Parts can then be labeled and sold according to their actual levels of performance.

The ATE, or tester, generally includes a host computer that runs software for controlling various tests of semiconductor devices. The software prescribes signal parameters for stimuli that drive the device under test (DUT), and prescribes expected data for responses to be sampled from the DUT. A pattern generator translates the signal parameters from the test software into timing signals. Specialized circuitry called pin electronics then translates the timing signals from the pattern generator into electronic stimuli to be applied to the DUT. The pin electronics also translates the timing signals into windows for sampling electronic responses from the DUT.

The pin electronics are generally grouped among a number of circuits of the ATE called "channels." The channels perform a variety of tester functions and generally serve as a signal interface between the tester and the DUT. Each channel typically includes a driver circuit, a detector circuit, and a load. The present invention pertains to an improvement to driver circuits used in pin electronics channels of ATE.

FIG. 1 illustrates the conventional role of driver circuits in ATE systems. As shown in FIG. 1, an ATE system includes a host computer 118, a pattern generator 120, and plurality of driver circuits, shown generally as driver circuits 110a–110e. The host computer 118 runs test software that defines tests to be executed. The pattern generator 120 converts instructions from the test software into precisely controlled, high-resolution timing signals. The channels then use the timing signals to provide precisely timed stimulus and response.

Each driver circuit 110a–110e supplies an output signal to the DUT 124 and typically includes a first source 112, a second source 114, and a switching element 116. The first source 112 generates a high voltage level VIH, and the second source 114 generates a low voltage level VIL. The voltage levels VIH and VIL typically correspond to high and low logic levels of digital circuitry within the DUT 124. Under control of a High/Low ("H/L") timing signal 122 from the pattern generator 120, the switching element 116 alternately passes the output of first source 112 and the output of the second source 114 to the output of the driver circuit. In this manner, voltage levels are provided to the DUT 124 that alternate between VIH and VIL with precisely controlled timing.

Operating the ATE system of FIG. 1 involves both static and dynamic activities. Static activities are generally not timing critical. They include, for example, programming digital-to-analog converters (DACs) for establishing values for VIH and VIL, and programming DACs or other devices for establishing clock periods and edge locations for the pattern generator 120. In contrast, dynamic activities generally are time critical. Dynamic activities include "bursts," waveforms that have periods and/or edge placement precisely controlled by the pattern generator. Once the ATE system has been statically programmed, an instruction from the test program starts a burst. The pattern generator 120 produces precisely timed, high-resolution signals, and the driver circuits generate stimuli in response to those timing signals.

FIGS. 2a and 2b illustrate two driver topologies of the prior art, which employ the general approach described above. In FIG. 2a, a driver circuit includes a voltage buffer 210 having a complementary pair of bipolar output transistors 218 and 220 arranged in a "push-pull" configuration. The driver circuit also includes a VIH buffer 212 and a VIL buffer 214. The voltage levels of the VIH and VIL buffers 212 and 214 are statically programmed by the host computer. In response to a dynamic H/L timing signal 226, outputs of these buffers are dynamically switched through a multiplexor 216 to the bases of the transistors 218 and 220. An alternating voltage then appears at the output of the voltage buffer 210.

A transmission line 222 conveys the output of the voltage buffer 210 to a DUT 224. The DUT 224 is terminated to a termination voltage $V_{DUT}$. Generally, the characteristic impedance of the transmission line 222 approximately equals 50 ohms. If the impedance of the DUT 224 also equals 50-ohms, output signals from the voltage buffer 210 are transmitted to the DUT 224 without significant. Optionally, a backmatch resistor (not shown) is coupled in series with the output of the voltage buffer 210 to raise the overall output impedance of the voltage buffer 210 to 50 -ohms. If the impedance of the DUT is different from 50-ohms, the backmatch resistor terminates reflections from the DUT 224.

FIG. 2b illustrates another driver topology of the prior art, which employs a current buffer 250. The current buffer 250 includes a VIH buffer 252, a switchable current buffer 254, and a resistor 256. The switchable current buffer 254 generates an output current that corresponds to either a high output current IH or a low output current IL. The host computer statically programs the VIH buffer 252 and the switchable current buffer 254 for appropriate values of VIH, IH, and IL. Once programmed, the VIH buffer maintains its statically programmed value. In response to a dynamic timing signal H/L 266, the switchable current buffer 254 generates a current that alternates between IH and IL dynamically.

The steady-state output voltage of the driver circuit of FIG. 2b results from the combined contributions of the switchable current buffer 254, the VIH buffer 252, the resistor 256 (assumed to be 50-ohms), a DUT 264, and the DUT termination voltage $V_{DUT}$. The steady-state output voltage can be expressed as follows:

$$V_{OUT} = \frac{50V_{DUT} + R_{DUT}VIH - 50R_{DUT}I_{IN}}{50 + R_{DUT}}. \quad (1)$$

In this expression, $I_{IN}$ equals either IH or IL, depending on the state of the H/L signal 266, and $R_{DUT}$ equals the resistance of the DUT 264.

We have recognized a need for driver circuits that can deliver high voltage range and very high speed. We have experimented with the topologies of FIG. 2a and FIG. 2b and have found that neither of these circuits appears to be capable of meeting both requirements.

SUMMARY OF THE INVENTION

With the foregoing background in mind, it is an object of the invention for a driver circuit to have both high voltage range and high speed.

To achieve the foregoing object and other objectives and advantages, a driver circuit includes a voltage buffer having an output and generating an output voltage that has at least two voltage levels. The output voltage is variable between one voltage level and another voltage level in response to a first dynamic timing signal. The driver circuit also includes a current buffer having an output coupled to the output of the voltage buffer. The output current of the current buffer has at least two current levels, and is variable between one current level and another in response to a second dynamic timing signal.

According to one aspect of the invention, the output voltage of the voltage buffer remains at one voltage level and the current buffer is operated dynamically.

According to another aspect of the invention, the output current of the current buffer remains at one current level and the voltage buffer is operated dynamically.

Additional objects, advantages, and novel features of the invention will become apparent from a consideration of the ensuing description and drawings.

BRIEF DESCRIPTION OF THE DRAWINGS

The invention will be better understood with reference to the accompanying drawings, in which aspects of the prior art and the invention are illustrated as follows.

DESCRIPTION OF THE PREFERRED EMBODIMENT

Topology and Operation

Figure 3:
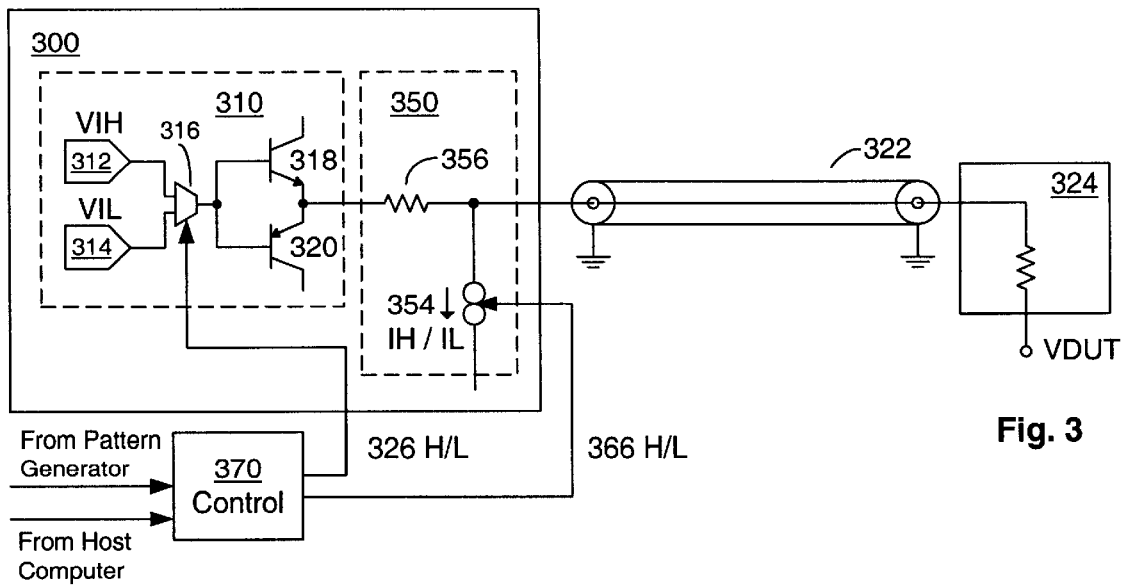
FIG. 3 is a simplified, partial schematic of a driver circuit according to the invention.

FIG. 3 illustrates a driver circuit 300 according to the invention. The driver circuit 300 includes a voltage buffer 310, a series impedance 356, and a current buffer 350. The voltage buffer 310 has an output coupled to a first terminal of the series impedance 356. The current buffer 350 has an output coupled to a second terminal of the series impedance 356. The output of the current buffer 350 is also coupled to a DUT 324. A first H/L timing signal 326 dynamically operates the voltage buffer 310, and a second H/L timing signal 366 dynamically operates the current buffer 350.

Figure 1:
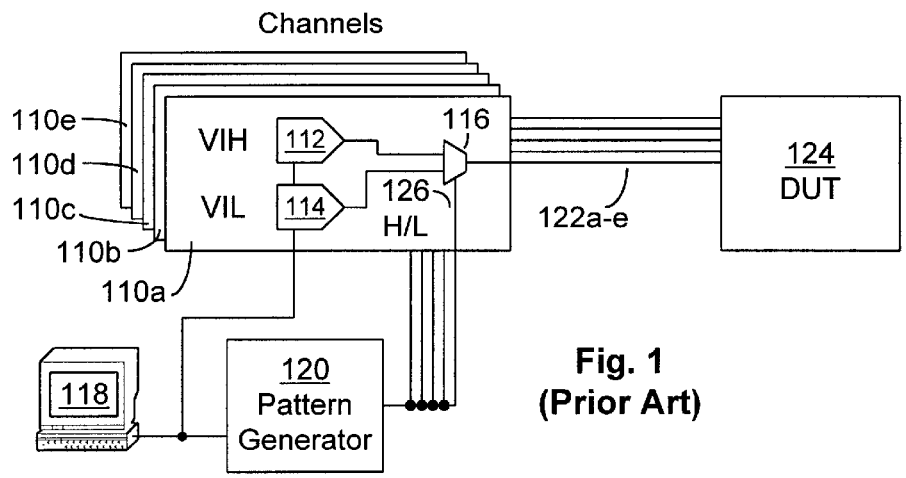
FIG. 1 is a partial block diagram of an ATE system that uses driver circuits to provide stimuli to a device under test, according the prior art.
Figure 2A:
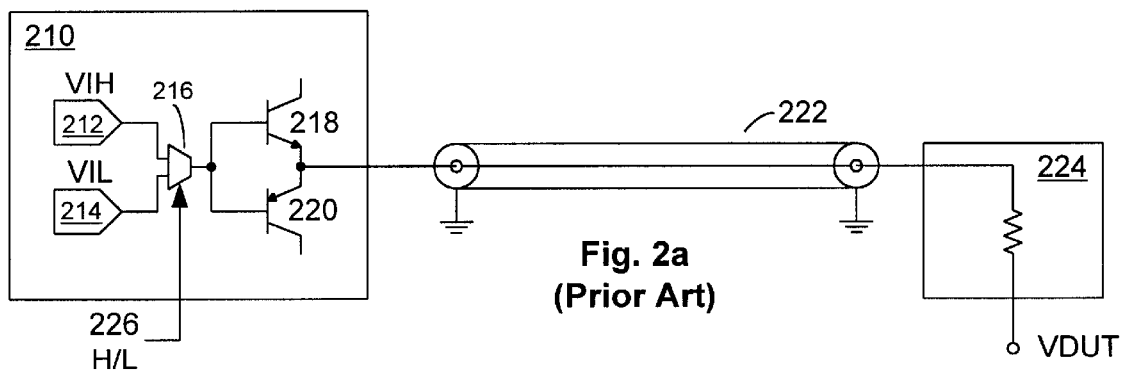
FIG. 2a is a partial schematic of a driver circuit according to the prior art that employs a dynamically switchable voltage buffer.
Figure 2B:
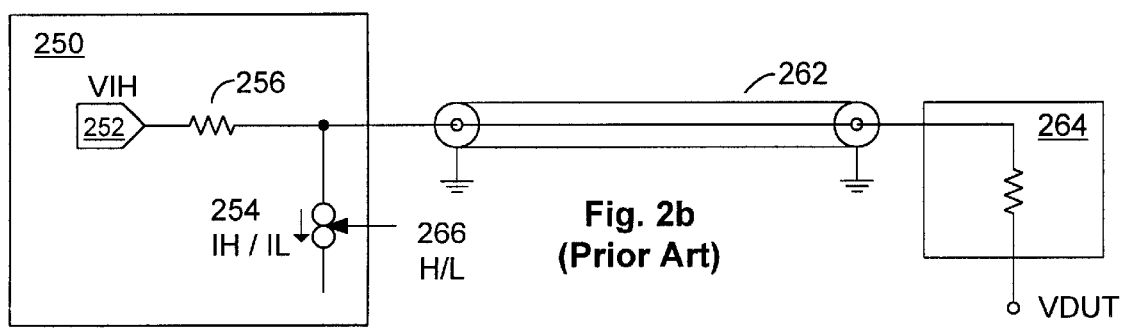
FIG. 2b is a partial schematic of another driver circuit according to the prior art that employs a dynamically switchable current buffer.

We have recognized that the voltage buffer 210 of FIG. 2a can generate output voltages very close to its power supply terminals (generally the collectors of transistors 218 and 220). This topology is therefore valuable where high voltage range is desired. We have also recognized that the current buffer 250 of FIG. 2b can generate fast edge speeds. This topology is therefore valuable where high output frequency is desired.

The driver circuit 300 of FIG. 3 can be used to generate output signals that have high voltage swing and to generate output signals that have high frequency. During the execution of a test program, test instructions are issued. The test instructions designate high and low voltage levels of output signals to be applied to the DUT 324, as well as clock speed and edge locations for the output signals.

A computer program, for example a device driver, determines whether the driver output signal specified by the test instructions exceeds the frequency limitations of the voltage buffer 310. If it does not exceed the maximum frequency, the driver circuit 300 assumes a first mode, in which the current buffer 350 is held constant while the voltage buffer 310 is operated dynamically. In this mode, the VIH and VIL buffers 312 and 314 are programmed with appropriate voltages, and the first H/L signal 326 switches the voltage buffer 310 to alternately apply VIH and VIL to the voltage buffer's output. As the voltage buffer operates, the current buffer 350 maintains a substantially constant output current. The constant output current may be achieved, for example, by disabling the current buffer, by holding the second H/L signal 366 constant, or by programming IH and IL to equal values.

If, however, the desired output signal exceeds the frequency limits of the voltage buffer 310, the driver circuit 300 assumes a second mode. In this mode, the voltage buffer 310 is held constant and the current buffer 350 is operated dynamically. The second H/L signal 366 switches the current buffer 354 to dynamically vary the output current of the current buffer 350 between IH and IL. As the current buffer 350 switches, the voltage buffer 310 maintains a substantially constant output voltage. The output of the voltage buffer may be held constant, for example, by forcing the voltage buffer to zero volts, by holding the first H/L timing signal 326 constant, or by programming VIH and VIL to produce equal values.

The driver circuit thus has two distinct modes of operation—constant current, switched voltage, and constant voltage, switched current. In both modes, the following equation governs the steady-state output voltage:

$$V_{OUT} = \frac{R_s V_{DUT} + R_{DUT}V_{IN} - R_s R_{DUT}I_{IN}}{R_S + R_{DUT}}. \quad (2)$$

In this expression, $V_{IN}$ equals the output voltage of the voltage buffer 310, $I_{IN}$ equals the output current of the current buffer 350, and $V_{DUT}$ equals the termination voltage of the DUT 324. $R_s$ equals the value of the series impedance 356, and $R_{DUT}$ equals the resistance of the DUT 324.

The speed of the desired output signal need not be the sole determinant of whether the first or the second mode is chosen. According to one variation, $R_{DUT}$ is also considered in selecting the mode. Generally, the voltage buffer 310 has greater output voltage range than the current buffer 350. To illustrate, if $R_{DUT}$ is very large compared with $R_s$, nearly the entire output signal generated by the voltage buffer 310 is applied to the DUT 324. The series impedance 356 merely acts as a backmatch resistor to absorb reflections from the DUT. If $R_{DUT}$ is small compared with $R_s$, however, the situation may be reversed, and the current buffer 350 may actually provide greater voltage range. For example, if $R_{DUT}$ is 50 ohms and $V_{DUT}$ is zero volts, the voltage buffer 310 must generate twice the desired DUT voltage to overcome the voltage drop across the series impedance 356 and its own output impedance. Under circumstances in which $R_{DUT}$ is small, therefore, the current buffer may be preferred for generating large voltage swings.

To control its operation, the driver circuit 300 preferably also includes a control circuit 370. The control circuit 370 receives one or more timing signals from a pattern generator, such as the pattern generator 120, and generates the first and second H/L signals 326 and 366. The control circuit 370 preferably also receives one or more control signals from the host computer. The control circuit 370 uses the control signal or signals to select which of the first and second H/L signals 326 and 366 is to be operated dynamically and which is to be held constant. Separate instances of the control circuit 370 may be provided for separate instances of the driver circuit 300. Alternatively, a single control circuit 370 can be provided for multiple instances of the driver circuit 300.

According to one embodiment, the control circuit 370 switches the driver circuit 300 between the first and second modes. The control circuit 370 receives a control signal from the host computer that identifies which mode to establish. The control circuit 370 also receives a timing signal from the pattern generator. The control circuit 370 passes the timing signal to either the voltage buffer 310 or the current buffer 350, depending upon the state of the control signal, for operating the voltage buffer or the current buffer dynamically. Most existing testers provide their driver circuits with one dynamic timing signal each. The control circuit 370 thus enables the driver circuit 300 to be used in these current testers, without requiring the testers to undergo significant architectural changes.

Component Characteristics

Figure 4:
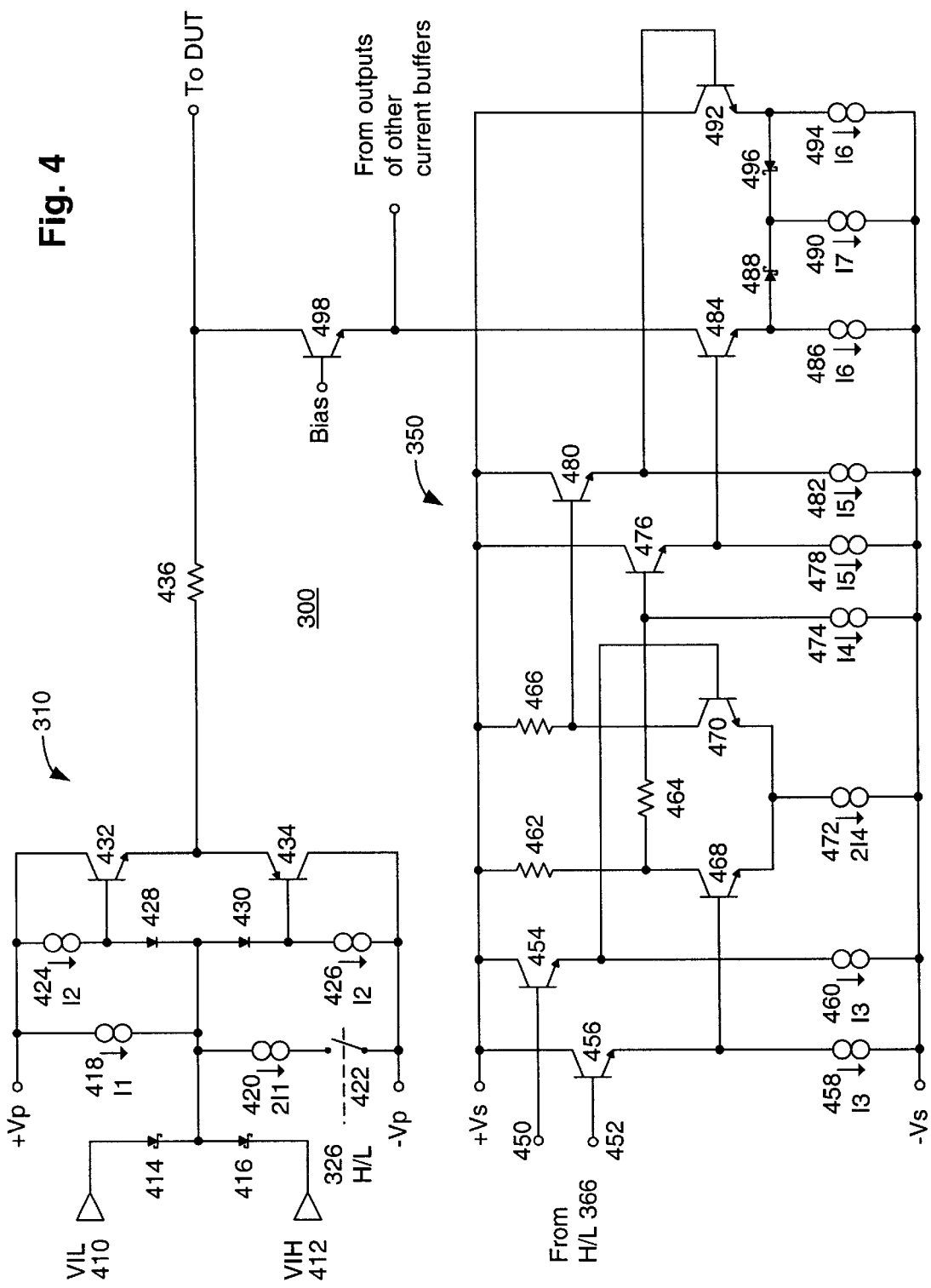
FIG. 4 is a more detailed partial schematic of the driver circuit of FIG. 3.

FIG. 4 illustrates a more detailed, partial schematic of the driver circuit 300 according to the invention. As shown in FIG. 4, the voltage buffer 310 includes a complementary output stage including transistors 432 and 434 that are biased by current sources 424 and 426 and diodes 428 and 430. Preferably, the complementary output stage operates in Class AB mode, i.e., both the NPN transistor 432 and the PNP transistor 434 always remain at least slightly conductive.

VIH and VIL buffers 412 and 410 each provide output voltages that correspond, respectively, to high and low digital levels of the DUT 324. Preferably, both the VIH buffer 412 and the VIL buffer 410 continuously provide their respective output voltages, regardless of the state (high or low) of the driver circuit 300. The VIH and VIL buffers are preferably programmed statically, prior to dynamic operation of the driver circuit. The output of the VIH buffer 412 is generally more positive than the output of the VIL buffer 410. Diodes 414 and 416 ensure that only one buffer, either VIH or VIL, conducts to the biasing circuit at any one time. Current sources 418 and 420 and a switch 422 cause the output of either the VIH buffer 412 or the VIL buffer 410 to conduct to the biasing circuit of the complementary output stage. The output of the voltage buffer 310 then follows whichever signal appears at the biasing circuit. When the switch 422 is open, a current I1 conducts through the current source 418, causing diode 416 to become conductive and diode 414 to become non-conductive. The output of the VIH buffer 410, subject to various diode drops, then appears at the output of the voltage buffer 310, to establish a high output level.

When the switch 422 is closed, however, a current 2I1 flows through current source 420. This current is twice the current I1 that flows through current source 418. A net negative current I1 thus flows, causing diode 416 to become non-conductive and diode 414 to become conductive. In this manner, the output of the VIL buffer 410, subject to various diode drops, appears at the output of the voltage buffer 310, and a low output level is established.

The switch 422 is operated by the dynamic H/L timing signal 422. With this arrangement, statically programmed voltages for the VIH and VIL buffers are dynamically switched to the output of the voltage buffer 310.

The topology of the voltage buffer 310 is provided for illustration, and is not intended to limit the manner in which the voltage buffer 310 can be constructed in accordance with the invention. Various modifications are known by those skilled in the art, and may be successfully used in the voltage buffer 310.

FIG. 4 also illustrates the current buffer 350. The current buffer 350 includes an output transistor 484 that conducts the entire output current of the current buffer 350. Alternatively, multiple transistors can be provided to conduct the output current of the current buffer 350. The use of a single output transistor is preferred, however, as it promotes high-speed operation of the current buffer by reducing nodal capacitances at the output of the driver circuit 300.

The output transistor 484 is actually part of a differential circuit that includes transistors 484 and 492, current sources 486, 490, and 494, and diodes 488 and 496. The differential circuit applies one of two currents, IH or IL, to the output of the current buffer 350. The current sources 486, 490, and 494 are statically programmable, via the host computer, to assume stable current values. Both of the current sources 486 and 494 are programmed to a current I6, and the current source 490 is programmed to a current I7. I7 is generally larger than I6.

The output current is selected by applying control signals to the transistors 484 and 492. These control signals originate respectively from the emitters of transistors 476 and 480. The transistors 484 and 492 are controlled differentially, from signals derived from the H/L timing signal 366. Specifically, a differential version of the H/L signal 366 is provided to the bases 450 and 452 of transistors 454 and 456. These transistors, as well as other level shifting and biasing circuitry (transistors 468, 470, 476, 480, current sources 458, 460, 472, 474, 478, 482, and resistors 462, 464, 466 ) control the voltages at the base of output transistor 484 and the base of transistor 492. When the H/L signal 366 is true, the level shifting and biasing circuitry raises the base of the output transistor 484 to a voltage higher than the base of transistor 492. This causes diode 488 to become conductive and diode 496 to become non-conductive. A current then flows through the collector of the output transistor 484 that substantially equals the sum I6+I7, which corresponds to the output low current IL, by design.

When the H/L signal 366 is false, the base of transistor 492 is raised to a value higher than the base of the output transistor 484. Consequently, diode 496 becomes conductive and diode 488 becomes non-conductive. The current through the collector of the output transistor 484 is then reduced to a value that substantially equals I6, which corresponds to the output high current IH, again by design. In this manner, the output of the current buffer 350 can be made to dynamically alternate between two predetermined output voltages, IH and IL.

As with the voltage buffer 310, the topology of the current buffer 350 is shown for purposes of illustration. It is not intended to limit the manner in which the current buffer 350 can be constructed in accordance with the invention. Various modifications are known by those skilled in the art, and may be successfully used in the current buffer 350.

The series impedance 356 is preferably a resistor, for example, the resistor 436 of FIG. 4. The value of the resistor 436 is preferably chosen so that the sum of its resistance and the output resistance of the voltage buffer 310 approximately equals 50-ohms. Choosing the resistance in this manner ensures that waveforms reflected from the DUT and traveling through a 50-ohm transmission line are terminated by the driver circuit 300.

Alternatives

Having described one embodiment, numerous alternative embodiments or variations can be made.

For example, the driver circuit as described above uses complementary bipolar transistors. However, this is merely an example. The circuit could instead be constructed using Field Effect Transistors (FETs), or using combinations of bipolar transistors and FETs. The driver circuit 300 could also be constructed using one polarity of transistor only, for example NPN transistors only. The driver circuit could thus take advantage of the high switching speed of NPN transistors provided in fabrication processes such as Silicon-Germanium.

Preferably, the driver circuit 300 is implemented within an application-specific integrated circuit (ASIC). However, this is not required. The driver circuit could also be implemented using discrete devices, hybrid circuits, or any combinations of ASICs, discrete devices, and hybrid circuits.

As described above, the driver circuit 300 is preferably controlled using a computer program, for example, a device driver. However, this is merely an example. The driver circuit 300 can also be controlled using direct memory write instructions, or it can be controlled manually.

In addition, the embodiment described above shows the voltage buffer 310 having two statically programmable levels—VIH and VIL—that can be dynamically switched to a DUT. This is merely an example. More than two static levels can be provided to supply multiple output levels, which are dynamically selectable. Thus, the driver circuit can be used with digital logic having greater than two states.

Similarly, the current buffer 350 is described above with two statically programmable current levels, IH and IL. Additional current levels can be provided for even greater flexibility. The additional current levels can be switched to the DUT via a single output transistor, as described above, or using multiple output transistors.

According to another variation, the driver circuit 300 includes multiple current buffers that each resembles the current buffer 350. One or more additional current buffers can be coupled to the output of the driver circuit 300. The outputs of the current buffers can be funneled through a single output transistor, or can be provided using separate output transistors. Alternatively, some outputs can be grouped together, while others are provided separately. These variations even further enhance the flexibility of the invention by providing an even greater number of dynamically selectable output levels.

If multiple current buffers are funneled through a single output transistor, that transistor may take the form of a cascode transistor coupled between the outputs of the current buffers and the output of the driver circuit. According to this embodiment, the cascode transistor has a collector coupled to the output of the driver circuit and an emitter coupled to the outputs of all of the current buffers (e.g., the collector of output transistor 484, for each current buffer). The cascode transistor thus conducts the output current of multiple current buffers to the output of the driver circuit without adding a large capacitive load to the output of the driver circuit.

Figure 5:
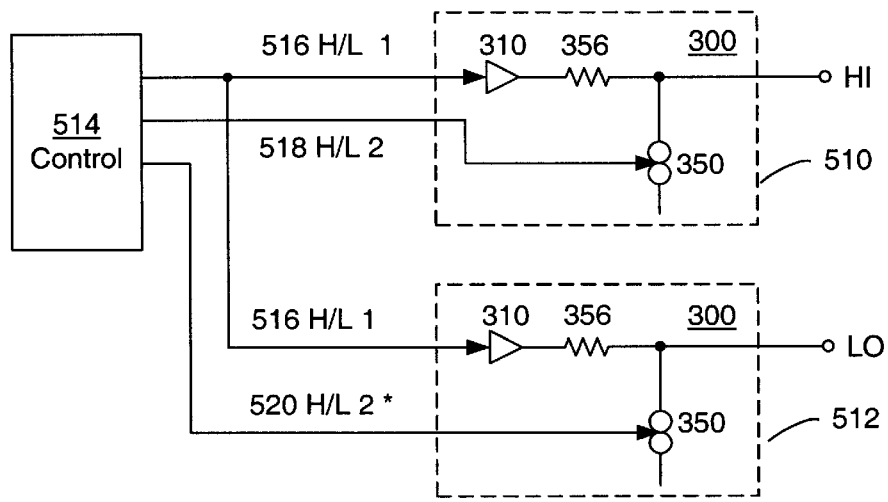
FIG. 5 is a simplified, partial schematic of an arrangement of driver circuits according to the invention for generating dynamic differential signals with dynamically variable common mode voltage.
Figure 6:
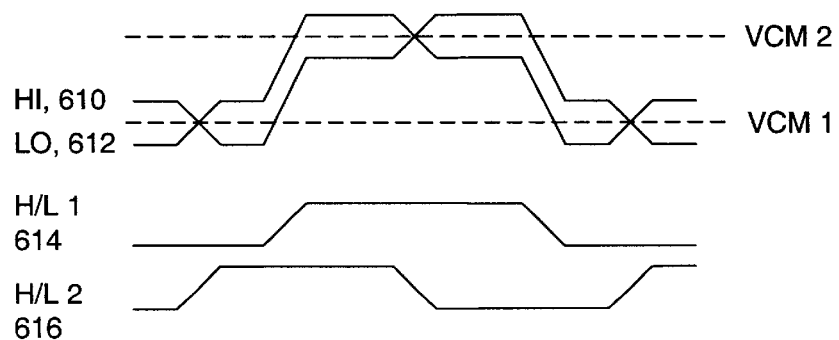
FIG. 6 is a timing diagram that shows waveforms of the circuit of FIG. 5.

A particularly attractive alternative aspect of the invention is illustrated in FIGS. 5 and 6. FIG. 5 illustrates an arrangement of two driver circuits 510 and 512 for generating a dynamic differential output signal having a dynamically variable common mode voltage. The arrangement of FIG. 5 may be particularly useful for testing IEEE 1394 ("Firewire") devices. These devices receive differential digital inputs, and the common mode voltage of differential input signals encodes a communication property of the signals, for example, transmission rate.

In the circuit of FIG. 5, two driver circuits 510 and 512 are statically programmed so that their corresponding values of VIH, VIL, IH, and IL are substantially identical (i.e., VIH of the first driver circuit equals VIH of the second, VIL of the first equals VIL of the second, and so forth). A differential output voltage is taken between the output of the first driver circuit 510 (HI) and the output of the second driver circuit 512 (LO).

A control circuit 514 generates H/L timing signals for the two driver circuits 510 and 512 in response to input signals from the pattern generator and the host computer. H/L timing signals 516, 518, and 520 from the control circuit 514 are applied to the driver circuits 510 and 512. The first H/L signal 516 controls both of the voltage buffers, and the second H/L signal 518—and its complement 520—controls both of the current buffers. One of the current buffers receives the complemented version of the second H/L signal to allow the two current buffers to be varied in opposite directions. In this arrangement, the voltage buffers generate the common mode voltage of the output signal and the current buffers generate the differential voltage. The roles of the voltage and current buffers can easily be reversed by complementing the timing signal for one of the voltage buffers with respect to the other, and driving the two current buffers from the same timing signal.

FIG. 6 is a timing diagram of waveforms from the circuit of FIG. 5. Waveforms 610 and 612 respectively illustrate the output voltages of the first and second driver circuits 510 and 512. Waveform 614 illustrates the first H/L timing signal 516, and waveform 616 illustrates the second H/L timing signal 518. In response to the first H/L signal 516, both signals 610 and 612 move together between a high common mode level and a low common mode level, due to the switching operations of the voltage buffers 310. In response to the second H/L signal 516, one output moves in one direction while the other output moves in the other direction, due to the switching operations of the current buffers 350.

In this example, VIH, VIL, IH and IL of the first driver circuit 510 respectively equal VIH, VIL, IH, and IL of the second driver circuit 512. For testing purposes, however, various errors can be introduced to deliberately generate non-ideal signals. For example, different levels of VIH (or VIL) can be provided to the two driver circuits to shift the voltages of the differential signals with respect to each other. The tolerance of a receiving device (the DUT) to this error can then be determined as part of a test procedure for that device. Similarly, IH (or IL) can be offset between the two driver circuits to vary the differential voltage swing of each side of the differential signal. Again, the sensitivity of the receiving circuit to this error can be determined.

It should be understood, therefore, that the invention may be practiced in a variety of different ways, and should be limited only by the spirit and scope of the appended claims.

What is claimed is:

1. A driver circuit for supplying a digital signal to a device under test (DUT), comprising:
   a voltage buffer having an output and generating an output voltage having at least a first voltage level and a second voltage level, the output voltage being variable between the first voltage level and the second voltage level in response to a first dynamic timing signal;
   a current buffer having an output and generating an output current having at least a first current level and a second current level, the output current being variable between the first current level and the second current level in response to a second dynamic timing signal; and
   a series impedance having a first node coupled to the output of the voltage buffer and a second node coupled to the output of the current buffer.

2. A driver circuit as recited in claim 1, wherein the driver circuit has at least two operating modes,
   a first mode wherein the voltage buffer remains at one voltage level and the current buffer is dynamically operated to assume different current levels dynamically; and
   a second mode wherein the current buffer remains at one current level and the voltage buffer is dynamically operated to assume different voltage levels.

3. A driver circuit as recited in claim 1, wherein both the voltage buffer and the current buffer are dynamically operated to deliver a dynamic output signal having more than two discrete levels.

4. A driver circuit as recited in claim 1, wherein the at least two voltage levels of the voltage buffer and the at least two current levels of the current buffer are statically programmable by a host computer for voltage and current, respectively.

5. A driver circuit as recited in claim 1, further comprising a control circuit for selectively applying the first and second dynamic timing signals to the voltage buffer and current buffer.

6. A driver circuit as recited in claim 5, wherein the control circuit includes a de-multiplexing circuit having an input that receives a timing signal, a first output coupled to the voltage buffer, and a second output coupled to the current buffer, the de-multiplexing circuit selectively passing the timing signal to one of the first and second outputs in response to a control signal.

7. A driver circuit as recited in claim 1, wherein the voltage buffer comprises:
   a first buffer circuit that establishes a first level of the voltage buffer;
   a second buffer circuit that establishes a second level of the voltage buffer;
   an output stage; and
   switching circuitry coupled to the first and second buffer circuits and to the output stage, for alternately coupling outputs of the first buffer circuit and the second buffer circuit to the output stage in response to the first timing signal.

8. A driver circuit as recited in claim 7, wherein the output stage of the voltage buffer is a complementary output stage operating in class AB.

9. A driver circuit as recited in claim 1, wherein the current buffer is a unidirectional current buffer.

10. A driver circuit as recited in claim 9, wherein the current buffer is a first current buffer, and further comprising:
    a second current buffer having an output coupled to the output of the first current buffer, the second current buffer being dynamically switchable between at least two values of current in response to a third dynamic timing signal.

11. A driver circuit as recited in claim 10, further comprising a cascode transistor having a collector coupled to the output of the driver circuit and an emitter coupled to the output of the first and second current buffers.

12. A driver circuit as recited in claim 10, wherein the first and second current buffers are fabricated in a silicon-germanium process, and the outputs of the first and second current buffers each include a collector of an NPN transistor made using the silicon-germanium process.

13. A driver circuit as recited in claim 10, wherein the first current buffer provides one signal of a differential signal pair, and the second current buffer provides a common mode signal, the driver circuit thereby delivering an output signal having both a dynamic differential level and a dynamic common mode level.

14. A method of using a driver circuit, the driver circuit including a voltage buffer having an output and a current buffer having an output coupled to the output of the voltage buffer and to a device under test (DUT), the method comprising:
    selecting one of high-speed edges and high voltage range for application of driver signals to the DUT;
    dynamically operating the current buffer responsive to high-speed edges being selected; and
    dynamically operating the voltage buffer responsive to high voltage range being selected.

15. A method as recited in claim 14, further comprising controllably applying dynamic timing signals to the voltage buffer and current buffer.

16. A method as recited in claim 14, further comprising:
    computing values for the output voltage of the voltage buffer and the output current of the current buffer to produce a desired output voltage of the driver circuit.

17. A method as recited in claim 16, wherein the output voltage of the driver circuit is computed using the equation $$V_{OUT} = \frac{R_s V_{DUT} + R_{DUT} V_{IN} - R_s R_{DUT} I_{IN}}{R_S + R_{DUT}},$$

wherein $V_{IN}$ equals the output voltage of the voltage buffer, $I_{IN}$ equals the output current of the current buffer, $R_S$ equals the impedance between the output of the voltage buffer and the output of the current buffer, and $R_{DUT}$ equals the impedance of the DUT.

18. A method as recited in claim 14, wherein the step of dynamically operating the voltage buffer further includes maintaining a statically configured current for the current buffer.

19. A method as recited in claim 14, wherein the step of dynamically operating the current buffer further includes maintaining a statically configured voltage for the voltage buffer.

20. A method as recited in claim 14, further comprising using the driver circuit to test semiconductor devices.

21. A method as recited in claim 20, further comprising grading semiconductor devices according to their tested characteristics.

22. A method of using a pair of driver circuits in automatic test equipment, each driver circuit including a voltage buffer having an output and a current buffer having an output coupled to the output of the voltage buffer and to a device under test (DUT), the method comprising:

(a) dynamically operating one of the voltage buffer and the current buffer of a first driver circuit and the same one of the voltage buffer and the current buffer of a second driver circuit to generate a dynamic differential signal at the DUT; and (b) dynamically operating the other of the voltage buffer and the current buffer of the two driver circuits to generate a dynamic common mode signal at the DUT.

23. A method as recited in claim 22, wherein step (a) includes dynamically operating the voltage buffer, and step (b) includes dynamically operating the current buffer.

24. A method as recited in claim 22, wherein:

the voltage buffer of the first and second driver circuits both operate in response to a first dynamic timing signal; and the current buffer of the first and second driver circuits both operate in response to a second dynamic timing signal.

25. A method as recited in claim 22, further comprising:

dynamically operating the first and second driver circuits at a first common mode level;

dynamically changing the common mode level; and dynamically operating the first and second driver circuits at a second common mode level.

* * * * *